US009368656B2

(12) United States Patent
Van Den Donker et al.

(10) Patent No.: US 9,368,656 B2
(45) Date of Patent: Jun. 14, 2016

(54) BACK CONTACTED PHOTOVOLTAIC CELL WITH AN IMPROVED SHUNT RESISTANCE

(75) Inventors: Menno Nicolaas Van Den Donker, Weert (NL); Peter Andreas Maria Wijnen, Berg aan de Maas (NL)

(73) Assignee: Stichting Energieonderzoek Centrum Nederland, Petten (NL)

( * ) Notice: Subject to any disclaimer, the term of this patent is extended or adjusted under 35 U.S.C. 154(b) by 346 days.

(21) Appl. No.: 13/818,345

(22) PCT Filed: Aug. 23, 2011

(86) PCT No.: PCT/NL2011/050573
§ 371 (c)(1),
(2), (4) Date: Apr. 23, 2013

(87) PCT Pub. No.: WO2012/026812
PCT Pub. Date: Mar. 1, 2012

(65) Prior Publication Data
US 2013/0206226 A1    Aug. 15, 2013

(30) Foreign Application Priority Data

Aug. 24, 2010 (NL) ..................................... 2005261

(51) Int. Cl.
*H01L 31/0224* (2006.01)
*H01L 31/0216* (2014.01)
(Continued)

(52) U.S. Cl.
CPC .... *H01L 31/02245* (2013.01); *H01L 31/02161* (2013.01); *H01L 31/022425* (2013.01); *H01L 31/0516* (2013.01); *H01L 31/18* (2013.01);
(Continued)

(58) Field of Classification Search
CPC ............... H01L 31/02245; H01L 31/02161; H01L 31/02168; H01L 31/022458; H01L 31/022425; H01L 31/0516; H01L 31/18; H01L 31/1868; Y02E 10/50; Y02P 70/521
USPC .................................................. 136/243–265
See application file for complete search history.

(56) References Cited

U.S. PATENT DOCUMENTS 3,903,427 A     9/1975   Pack
5,457,057 A  * 10/1995   Nath et al. ...................... 438/67
(Continued)

FOREIGN PATENT DOCUMENTS

EP      0528311 A2    2/1993
EP      1763086 A1    3/2007
(Continued)

*Primary Examiner* — James Lin
*Assistant Examiner* — Liesl C Baumann
(74) *Attorney, Agent, or Firm* — The Webb Law Firm

(57) ABSTRACT

The invention relates to a photovoltaic cell, comprising a plate shaped substrate of a semiconductor material with a solar face and a connection face, a first volume of the substrate adjacent to the solar face is doped with a first polarity, the second volume is doped with a second polarity and the volumes are separated by a pn-junction, a number of apertures in the substrate extending between both faces and in which a plug has been positioned of which a part is conducting, contact tracks at the solar face of the substrate connected with the first volume and the conducting part of the plug, first contacts at the connection face of the substrate connected with the conducting part of the plug and second contacts located at the connection face of the substrate connected with the second volume, wherein the specific electrical conductivity of the plug decreases from its centre to the contact face with the substrate.

12 Claims, 2 Drawing Sheets

(51) Int. Cl.
*H01L 31/18* (2006.01)
*H01L 31/05* (2014.01)

(52) U.S. Cl.
CPC ............. *H01L 31/1868* (2013.01); *Y02E 10/50* (2013.01); *Y02P 70/521* (2015.11)

(56) References Cited

U.S. PATENT DOCUMENTS

| | | | |
|---|---|---|---|
| 5,828,117 A | * | 10/1998 | Kondo et al. .................. 257/458 |
| 6,081,017 A | * | 6/2000 | Kim et al. ..................... 257/431 |
| 7,485,245 B1 | * | 2/2009 | Konno .......................... 252/514 |
| 2008/0105299 A1 | * | 5/2008 | Krasnov ........................ 136/256 |
| 2008/0276981 A1 | * | 11/2008 | Kinoshita et al. ............. 136/244 |
| 2009/0183759 A1 | * | 7/2009 | Hishida ......................... 136/244 |
| 2010/0132775 A1 | * | 6/2010 | Le et al. ........................ 136/255 |
| 2010/0186803 A1 | * | 7/2010 | Borden et al. ................ 136/255 |

FOREIGN PATENT DOCUMENTS

| | | |
|---|---|---|
| EP | 1985233 A1 | 10/2008 |
| EP | 2068369 A1 | 6/2009 |

* cited by examiner

BACK CONTACTED PHOTOVOLTAIC CELL WITH AN IMPROVED SHUNT RESISTANCE

BACKGROUND OF INVENTION

1. Field of the Invention

The invention relates to a photovoltaic cell, comprising a plate shaped substrate of semiconductor material with a solar face and a connection face, wherein a first volume of the substrate adjacent to the solar face has been doped with a first polarity, substantially the remaining second volume of the substrate has been doped with a second polarity opposite the first polarity, and in which the first and the second volumes are separated by a pn-junction. Such photovoltaic cells are generally known.

2. Discussion of the Prior Art

Further photovoltaic cells of the above known kind are known comprising a number of through apertures in the substrate extending between both faces of the substrate and in which an electrically conducting plug has been positioned, second connection contacts located at the connection face of the substrate electrically connected with the second volume of the substrate, contact tracks located at the solar face of the substrate electrically connected with the first volume of the substrate and with the electrically conducting plug in the through apertures. The connecting face can also can be designated as the 'shadow face'.

These photovoltaic cells are known as 'metal wrap though cells'. They have the advantage that the connections only have to be made at a single face simplifying the assembly of these cells to form a solar panel. Such cells are described in the European Patent applications EP-A-2 068 369 and EP-A-1 985 233.

Photovoltaic cells, in particular those of the kind referred to above have a so called shunt resistance representing a parasitic electric conduction path between both connections. This shunt resistance is dominantly present in and surrounding the electrical connections between the solar face and the connection face of the substrate. Indeed the electrical potential generated on the solar face of the substrate is carried through the electrical conducting plugs in the through apertures to the connecting face of the substrate where this potential is available for connection. The protection against this shunt resistance is, in the prior art, realized by forming a low ohmic homogeneous and continuous doping of the first polarity in and on both faces surrounding the through aperture, as described in EP-A-1 985 233. EP-A-2 068 369 discloses a thicker passivation layer, typically thicker than 200 nm, on the connection face and the walls of the apertures.

As the process of homogeneous and continuous doping of the first polarity is optimized for the properties on the solar face of the substrate, that is among others a good electrical connection to the solar face metal grid, doping level will be quite high and corresponding sheet resistance quite low. This lower ohmic doping of the first polarity causes only a limited lateral resistance on the shadow face of the substrate and hence a limited blockage to a lateral leakage current. This leads to a shunt resistance with a value substantially lowering the efficiency of the photovoltaic cell.

The passivation layer on the walls of the through aperture is often applied together with such a passivation layer by a common process. The consequence thereof is that the properties of this passivation layer are the same on the faces of the substrate as on the walls of the through apertures. As the process for obtaining the passivation layer is optimized for the properties on the faces of the substrate, that is the avoidance of the recombination of charge carriers, the properties of the passivation layer for obtaining a good electrical insulation are suboptimal. This leads to a shunt resistance with a value substantially lowering the efficiency of the photovoltaic cell.

In particular in situations wherein the cell is located in less sunny conditions wherein the leak or shunt current is large in relation to the relatively low current generated by the decreased amount of solar light the influence of the leak current on the efficiency is significant. This is less the case in sunny circumstances wherein the generated current is larger so that the leak current has a relatively smaller influence.

To avoid these disadvantages U.S. Pat. No. 3,903,427 provides a photovoltaic cell, comprising a plate shaped substrate of a semiconductor material with a solar face and a connection face, wherein a first volume of the substrate adjacent to the solar face is doped with a first polarity, substantially the remaining second volume of the substrate is doped with a second polarity opposite the first polarity and in which the first and the second volumes are separated by a pn-junction extending substantially parallel to the main plane of the substrate, a number of through apertures in the substrate extending between both faces of the substrate and in each of which a single piece plug has been positioned of which at least a part is electrically conducting, which part is adapted to provide an electrical conducting connection between the solar face and the connection face, contact tracks located at the solar face of the substrate and being electrically connected with the first volume of the substrate and with the electrically conducting part of the plug, first contacts located at the connection face of the substrate and being electrically connected with the electrically conducting part of the plug and second contacts located at the connection face of the substrate and being electrically connected with the second volume of the substrate.

This insulating jacket substantially increases the value of the inherent shunt resistance, while further the increased shunt resistance offers the possibility to decrease the thickness of the doping layer on the shadow face of the substrate without adverse effects on the efficiency of the solar cell or even completely remove said doping layer. It is noted that the shunt resistance is primarily present in the part of the cell adjacent to the contact face. However the preparation of such an insulating jacket requires a separate processing step, increasing process time, required equipment and costs.

The aim of the invention is to provide such a solar cell which can be produced for lower costs.

SUMMARY OF THE INVENTION

This aim is reached in that the specific electrical conductivity of the plug decreases substantially from its centre to the contact face with the substrate.

This feature allows the preparation of such a conducting plug with an insulating jacket in a single process step, leading to a simpler and hence cheaper process.

The invention relates further to a method for producing a photovoltaic cell, comprising the steps of providing a plate shaped substrate of semiconductor material with a solar face and a connection face, wherein a first volume of the substrate adjacent to the solar face has been doped with a first polarity, substantially the remaining second volume of the substrate has been doped with a second polarity opposite the first polarity, and in which the first and the second volumes are separated by a pn-junction, extending substantially parallel to the main plane of the substrate providing through apertures between both faces in the substrate, providing plugs adapted to provide an electrical conducting connection between the solar face and the connection face in each of the apertures, applying first contacts on the connection face at the location of the apertures to make a connection with the plugs, applying second contacts on the connection face avoiding the location of the apertures to make a connection with the second volume and applying contact tracks on the solar side connecting the plugs with the first volume, wherein the plugs are applied in the through apertures as a paste containing conducting and non conducting particles in a plastic mass curable to a solid, that the paste is cured to a solid plug of which the specific electrical conductivity decreases substantially from its centre to the contact face with the substrate.

Preferably the plugs each comprise an electrically insulating jacket surrounding at least a section of the electrically conducting part of the plugs. This embodiment provides a border between the insulating jacket and the conducting core of the plug, although the border between those two parts may take different shapes. The aim is to provide a border which is as discrete as possible to concentrate all conducting particles for obtaining a low resistance and to concentrate all insulating particles in the jacket to have a resistance as high as possible to make the leak current as low as possible. However the processes taking place during the curing may lead to a border having a certain thickness and having a continuous gradient between the insulating jacket and the conducting core of the plug. It is further possible that the border forms a substantial part of the plug or even the whole of the plug. In the latter case the gradient of conductivity may vary of the full cross section of the plug. It may be substantially constant, although it is assumed that the gradient is higher in the intermediate, border area and that the gradient is smaller at the edges and the centre of the plug.

A structural preferred embodiment provides the feature that the electrically insulating jackets extend over the full thickness of the substrate. It has appeared that a substantial part of the path contributing to the shunt resistance leads to the direct surroundings of the aperture at the connections face, so that the features of this embodiment make a further contribution in increasing the shunt resistance. However, it is not excluded that the electrically insulating jackets extend over a section of the thickness of the substrate.

As the apertures are often, although not necessarily provided through machining, it is preferred that the apertures are cylindrical, leading to substantially cylindrical plugs.

Preferably the specific resistance of the electrically insulating jacket at the contact face is greater than the specific resistance of the material of the substrate at the contact face. Indeed often the first volume having the first polarity is applied on the connection face, and then it often has a high resistance. It has appeared that a substantial part of the path contributing to the shunt resistance leads to the direct surroundings of the aperture at the connections face, so that the features of this embodiment make a further contribution in increasing the shunt resistance.

Preferably the material of the plugs is formed by heating and subsequent cooling of a paste as this leads to a more simple method.

The conductivity of the conductive part of the plug is obtained by the presence of conducting particles preferably formed by silver particles or particles from a silver compound. By using particles with varying sizes the effect of the gradual conductivity is obtained. Such a paste is obtainable by the company 'Ferro', 1000 Lakeside Avenue, Cleveland, Ohio, US. To simplify the processes, in particular in relation to the temperature, it is preferable that the contact tracks located at the solar face of the substrate, the first connection contacts and the plugs in the through apertures contain at least one same metal.

It is assumed that the gradual variation of the conductivity, is obtained at least partially because electrically insulating particles present in the paste concentrate during the curing process and form an insulating layer near the contact face with the substrate of the aperture in which the paste is applied. Indeed the invention requires the presence of an insulating layer near the contact face with the substrate. Further the conducting particles concentrate in the centre of the plug. Hence it is preferred that the plugs comprises a mixture of electrically conducting particles and electrically isolating particles in an organic medium.

Yet another embodiment provides the feature that the plugs are fused with or soldered to the material of the contact tracks on the solar face of the substrate, leading to a further simplification of the embodiment. The resulting plug must provide a proper connection with the contact tracks on the solar face of the substrate to allow conduction of the current generated at the solar face to the contact face of the substrate. This is contrary to the requirement of the concentration of the isolating particles to the walls of the apertures as in the present embodiment the conducting particles must also be present at the border face parallel to the main plain of the solar cell. Therefore a further embodiment provides the feature that the material of the plugs is fused with the material of the contact tracks on the solar face of the substrate This embodiment also provides a method wherein after the paste has been applied in the through apertures, a conducting paste forming the contact tracks on the solar face of the substrate is applied and that the substrate thus formed is heated to make the pastes fuse at the border between the through apertures and the solar face and form a solid electrically conducting connection after solidifying. Hence the sequence is important as it must be ascertained that the paste for forming the electric conducting plug fills the complete aperture so that no free spaces, resulting in cavities remain. When initially the paste is applied in the apertures, the paste can protrude in the complete aperture. If, however, the paste for forming the conducting tracks on the solar face is applied first, it may be that gas bubbles are trapped between the two quantities of paste, which may develop into cavities.

To combine the good conducting properties of the centre of the conducting plug with the insulating properties of the plug at its circumferential boundaries, it is preferred that the material of the plugs in the though apertures comprises a mixture of silver, a silver compound and glass particles in an organic medium.

As is known per se in the prior art, it is advantageous when the boundary face between the substrate and the apertures is covered by a passivation layer. This feature provides an effective measure against recombination of charge carriers, but it also provides some resistance against the leak current which the present invention aims to avoid. Nevertheless the features of the present invention can be fruitfully applied in this prior art structure, as an extra barrier against leak current is provided.

This embodiment also provides the feature that preceding the application of the paste in the through apertures the walls of those apertures are covered by a passivation layer.

To further simplify the process, it is preferred that the passivation layer extends also over the solar face of the substrate and that the contact tracks extend through the passivation layer in contact with the first volume, as this allows the application of a single passivation layer in a single process step.

This results in a method wherein the passivation layer on the walls of the apertures are formed during the application of a passivation layer on the solar face of the substrate.

To avoid recombination at the solar face of the substrate, the face is preferably covered with a passivation layer as is recited in the preceding claims. The current generated at the solar side of the substrate must however also be conveyed to the plugs in the through apertures, for which use is made of conducting tracks. These tracks extend, centred around each of the through apertures over a small part of the solar face of the substrate, as the solar radiation must reach the substrate. In principle it is possible to initially apply the conducting tracks and subsequently apply the passivation layer. Please note that the passivation layer does not only serve to avoid recombination but on the solar face of the substrate also functions to reduce reflection of solar light. From a process kind of view it is attractive to apply the passivation layer before the application of the conducting tracks. Hence it is referred that the passivation layer extends also over the solar face of the substrate and that the contact tracks extend through the passivation layer in contact with the first volume.

Preferably the first volume is adjacent to the connection face of the substrate in the areas surrounding the through apertures, in the connection face surrounding the apertures and first contacts grooves are present of which the depth is at least as great as the local depth of the first volume and that the second contacts are connected with the second volume outside the grooves. This embodiment is applicable in situations wherein recombination of charge carriers is avoided by increasing the doping of the second polarity close to the contact face. In the case substrate of the p-type this is often achieved by application of an aluminium layer forming an eutectic alloy with silicon and which solidifies to a silicon layer of the thickness of several micrometers and having a light doping of aluminium of about 0.01%. During the melting and recrystallization process the doping of the first polarity is usually compensated. The remaining aluminium layer must be connected to the second contacts to allow draining of the current to these contacts. Then the first volume is adjacent to the connection face of the substrate in de areas surrounding the through apertures, whereas in the connection face surrounding the apertures and first contacts grooves are present of which the depth is at least as great as the local depth of the first volume and and the second contacts are connected with the second volume outside the grooves. The extra doping at the connection face of the substrate increases the conductivity so that the layer thus formed is a good basis for the application of contacts. In the case of a substrate of the n-type, the same process sequence may be used, wherein the aluminium forms in this case the area of the second polarity. As an alternative use can be made of diffusion of the application of a phosphor doped layer at the contact face of the substrate.

An alternative method to avoid recombination of charge carriers at the contact face is the application of an appropriate passivation layer. Herein it is preferred that the passivation layer is applied on the connection face and that it extends also over the walls of the through apertures. Further a contact must be made between the second contacts and the second volume, for instance via locally opening point contacts as is described in EP-A-1 1763 086. A corresponding method provides that the passivation layer on the walls of the apertures is at least partially formed during the application of a passivation layer on the connection face of the substrate.

BRIEF DESCRIPTION OF THE DRAWINGS

Subsequently the present invention will elucidated with the help of the accompanying drawings wherein depict.

DETAILED DESCRIPTION OF THE PREFERRED EMBODIMENTS

Figure 1:
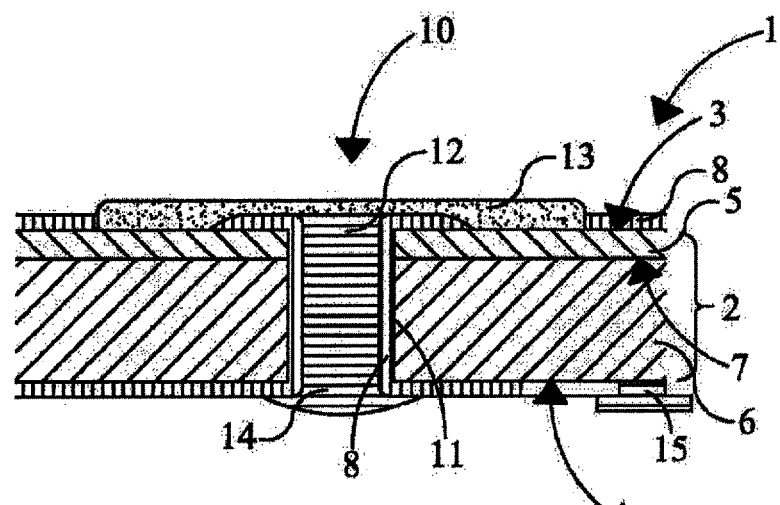
FIG. 1: a diagrammatic cross sectional view of a prior art photo voltaic cell.

FIG. 1 discloses a prior art photovoltaic cell 1, comprising a plate shaped substrate 2 with a solar face 3 and a connection face 4. Adjacent to the solar face 3 of the substrate a first volume 5 having a doping of a first polarity has been formed. The remaining second volume 6 of the substrate 2 has been doped with the opposite polarity. The area 7 separating the first volume from the second volume of the substrate is a pn-junction. On the solar face 3 a passivation layer 8 has been provided, serving to lower the reflection of the sunlight and to avoid the recombination of charge carriers. The passivation layer 8 may also be present on the connection face 4 of the substrate 2. Such a structure is the general structure of a photovoltaic cell.

In the substrate 2 a number of through apertures 10, preferably arranged to a regular grid has been provided. It is noted that in the present prior art example the passivation layer 8 extends over the walls 11 of the apertures 10, although this need not be the case. On these walls 11 the passivation layer serves as a insulation layer partially reducing the leakage current. Further the passivation layer extends over at least a part of the connection face 4 of the substrate. In the apertures 10 an electrical conducting plug 12 has been provided. This conducting plug 12 is connected with a number of electrical conducting tracks 13 centred around each of the apertures 10 and connected to the first volume 5 of the substrate 2. Herein the conducting tracks 13 extend through the passivation layer 8 to allow contact with the first volume 5. It is noted that the tracks 13 extend only over a small section of the surface area of the solar face 3. On the connection face 4 the plug 12 may extend over a slightly larger area than that of the aperture 10 to form first contacts 14 to allow contact to be made with the plug 12 at the connection face 4. Further second contacts 15 have been applied at the connection face 4 of the substrate 2. These second contacts 15 may extend through the passivation layer 8 if present at the contact face.

The solar cell 1 described above is a solar cell of the so called 'metal wrap through type', and the current generated by the solar light in the cell 1 is picked up by the first 14 and second 15 contacts. The charge carriers of a first polarity are conducted via the tracks 13 and the conducting plug 12 to the first contact 14, while the charge carriers of the opposite polarity are conducted to the second contacts 15, allowing the access the contacts of both polarities at the same connection face 4 of the substrate 2. The solar cells of this type suffer from a shunt resistance or rather a leak current between polarities.

Figure 2:
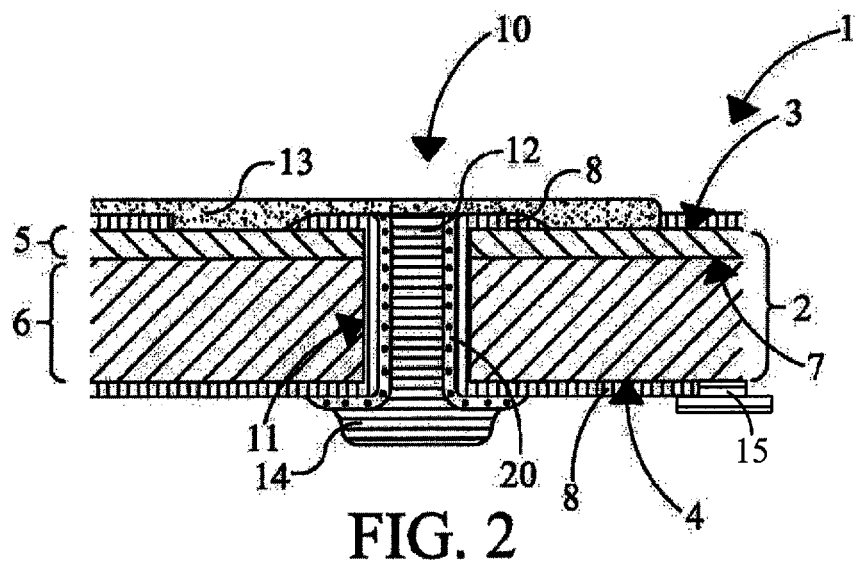
FIG. 2: a view according to FIG. 1 of a first embodiment of the present invention.

FIG. 2 shows a solar cell of a structure as the prior art solar cell depicted in FIG. 1. However in FIG. 2 between the walls 11 of the through aperture 10 and the conducting plug 12 an insulating layer 20 has been provided. This insulating layer 20 extends over the full thickness of the substrate 2 to offer an adequate insulation between the plug 12 and the surrounding second volume 6 of the substrate which usually has a different polarity than that of the plug 12. As depicted in FIG. 2 the insulating layer 20 also extends over a small area on the contact face 4 surrounding the plug 12 to avoid contact of the widened part of the plug 12 forming the second contact 14 with the second volume 6 of the substrate. The above described structure requires that the insulating layer 20 is applied in a separate process.

Figure 3:
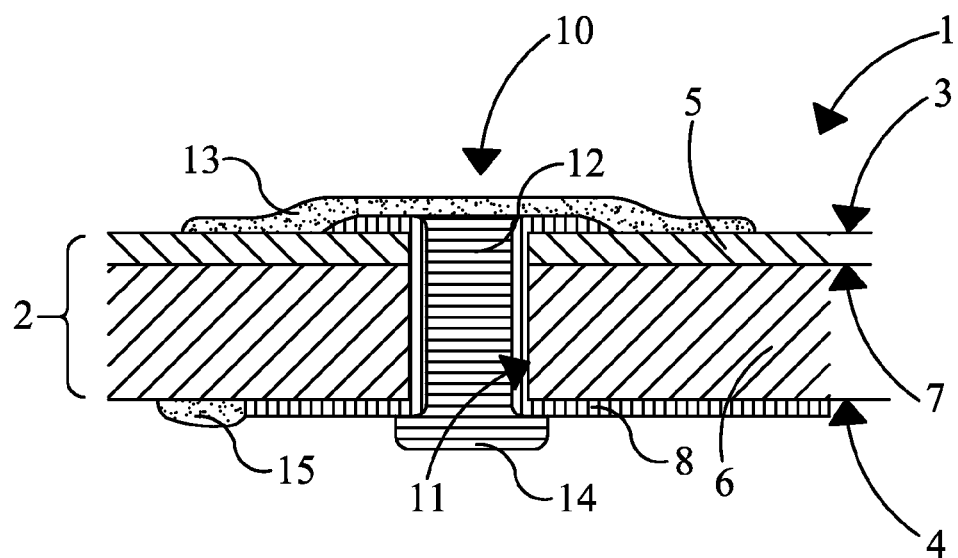
FIG. 3: a view according to FIGS. 1 and 2 of a second embodiment.

The embodiment of the invention depicted in FIG. 3 deviates from the embodiment depicted in FIG. 2 by the fact that the conducting plug 12 comprises an electrically insulating layer at its jacket face, that is adjacent to the walls of the through aperture. This embodiment avoids the separate process of applying a separate insulating layer, as according to this embodiment, the insulating layer is formed during the forming of the plug itself. However it is emphasized that the insulating layer in the plug may be and will in most cases be formed by gradual increase of the specific resistance from the centre of the plug towards the jacket thereof This embodiment makes use of a process wherein during the forming of the plug the specific resistance of the plug is amended from generally homogeneous to the distribution explained above, although other processes are not excluded. The resulting plug thus has the advantage that it can be made in a single process of application and curing while nevertheless the required distribution of specific resistance or, conductivity, is obtained. It is noted that, due to the gradual distribution of the conductivity, the current flowing through the plug will mainly be flowing in the vicinity of the centre of the plug, but that other parts of the plug will have a contribution to the conducting of the current. Hence the current density in the plug will be gradual as well.

The plug is preferably made by a process wherein a paste comprising conducting particles is applied in the aperture and wherein during the curing of the paste, forces are applied on the conducting particles to concentrate in the centre of the resulting plug. However it is not excluded that the paste also comprises insulating particles which are subjected to a force which urges them towards the extremities of the plug. These forces may be of adhesive or cohesive nature, or my be generated by electrical or magnetic means. Further it is not excluded that the walls of the aperture play a role in the forces urging the conducting and possibly insulating particles to their required positions. However these processes must assure that the faces of the plug adapted to make contact with the tracks on the solar face of the substrate and the contacts at the connection face of the substrate offer the possibility to make good electrical contact between the plug and the required contacts. A possibility to ensure good contact at the solar face is the application of the paste forming the plug, the paste forming the tracks and the subsequent simultaneous fusing of both pastes. A similar process may be envisaged at the contact face.

Figure 4:
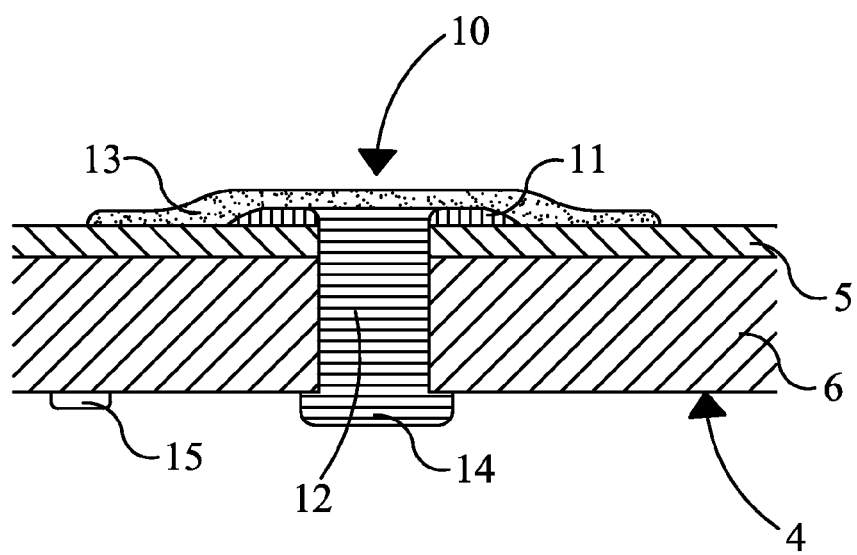
FIG. 4: a view according to FIGS. 1, 2 and 3 of a third embodiment.

Finally FIG. 4 discloses an embodiment wherein the plug is applied without passivation of the walls of the apertures. Herein the resistance avoid the shunt as is aimed for by the invention is only provided by the resistance of the plug. There are no further deviations form the preceding embodiment.

The invention claimed is:

1. A photovoltaic cell, comprising:
a plate shaped substrate of a semiconductor material with a solar face and a connection face, wherein a first volume of the substrate adjacent to the solar face is doped with a first polarity, the remaining second volume of the substrate is doped with a second polarity opposite the first polarity and in which the first and the second volumes are separated by a pn-junction extending parallel to the main plane of the substrate;
a number of through apertures in the substrate extending between both faces of the substrate and in each of which a single piece plug has been positioned of which at least a part is electrically conducting, which part is adapted to provide an electrical conducting connection between the solar face and the connection face;
contact tracks located at the solar face of the substrate and being electrically connected with the first volume of the substrate and with the electrically conducting part of the plug;
first contacts located at the connection face of the substrate and being electrically connected with the electrically conducting part of the plug; and
second contacts located at the connection face of the substrate and being electrically connected with the second volume of the substrate, wherein the specific electrical conductivity of the plug decreases from its centre to its circumferential boundaries.

2. The photovoltaic cell as claimed in claim 1, wherein the plugs each comprise an electrically insulating jacket surrounding at least a section of the electrically conducting part of the plugs.

3. The photovoltaic cell as claimed in claim 2, wherein the electrically insulating jackets extend over the full thickness of the substrate.

4. The photovoltaic cell as claimed in claim 2, wherein the electrically insulating jackets extend over a section of the thickness of the substrate.

5. The photovoltaic cell as claimed in claim 2, wherein the specific resistance of the electrically insulating jacket at its contact face with the substrate is greater than the specific resistance of the material of the substrate at the contact face with the electrically insulating jacket.

6. The photovoltaic cell as claimed in claim 5, wherein the plugs are fused with or soldered to the contact tracks on the solar face of the substrate.

7. The photovoltaic cell as claimed in claim 1, wherein the plugs are cylindrical.

8. The photovoltaic cell as claimed in claim 1, wherein the plugs are formed by heating and subsequent cooling of a paste.

9. The photovoltaic cell as claimed in claim 1, wherein the contact tracks located at the solar face of the substrate, the first contacts and the plugs in the through apertures contain at least one same metal.

10. The photovoltaic cell as claimed in claim 1, wherein the plugs comprises a mixture of electrically conducting particles and electrically insulating particles in an organic medium.

11. The photovoltaic cell as claimed in claim 1, wherein the boundary between the substrate and the apertures is covered by a passivation layer.

12. The photovoltaic cell as claimed in claim 11, wherein the passivation layer extends also over the solar face of the substrate and that the contact tracks extend through the passivation layer in contact with the first volume.

* * * * *